United States Patent

Into

[11] Patent Number: 6,157,032
[45] Date of Patent: Dec. 5, 2000

[54] SAMPLE SHAPE DETERMINATION BY MEASUREMENT OF SURFACE SLOPE WITH A SCANNING ELECTRON MICROSCOPE

[75] Inventor: Stephen W. Into, Harvard, Mass.

[73] Assignee: Schlumberger Technologies, Inc., San Jose, Calif.

[21] Appl. No.: 09/186,495

[22] Filed: Nov. 4, 1998

[51] Int. Cl.[7] .................................................. H01J 37/28
[52] U.S. Cl. .................... 250/310; 250/306; 250/307; 250/252.1
[58] Field of Search .................... 250/310, 306, 250/307, 252.1

[56] References Cited

U.S. PATENT DOCUMENTS

| 4,567,364 | 1/1986 | Kano et al. | 250/310 |
| 4,767,926 | 8/1988 | Murakoshi et al. | 250/310 |
| 4,910,398 | 3/1990 | Komatsu et al. | 250/310 |

OTHER PUBLICATIONS

J. Goldstein et al: "Scanning Electron Microscopy and X–Ray Microanalysis", Plenum Publishing, 1992, pp. 198–203 and 206–215.

*Primary Examiner*—Kiet T. Nguyen
*Attorney, Agent, or Firm*—Frishauf, Holtz, Goodman, Langer & Chick, P.C.

[57] ABSTRACT

The shape of a sample is determined with a scanning electron microscope ("SEM") by using electron emission from a surface to measure its slope. A surface of a sample is placed in the SEM's electron beam for several known angles, and respective measurements of the electron emission are obtained. A relationship between surface angle and electron emission is derived for the sample from the measurements. Then, as the electron beam is scanned along the surface to measure electron emission, this derived relationship is used to obtain the slope at each scanning point.

10 Claims, 2 Drawing Sheets

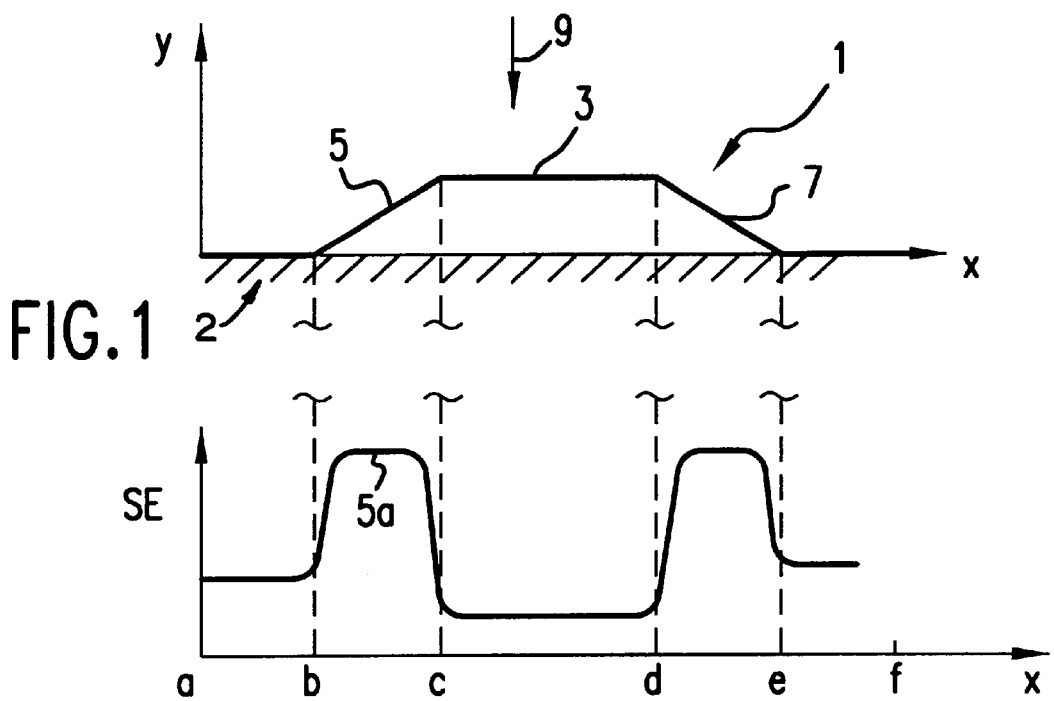
FIG.1
FIG.2
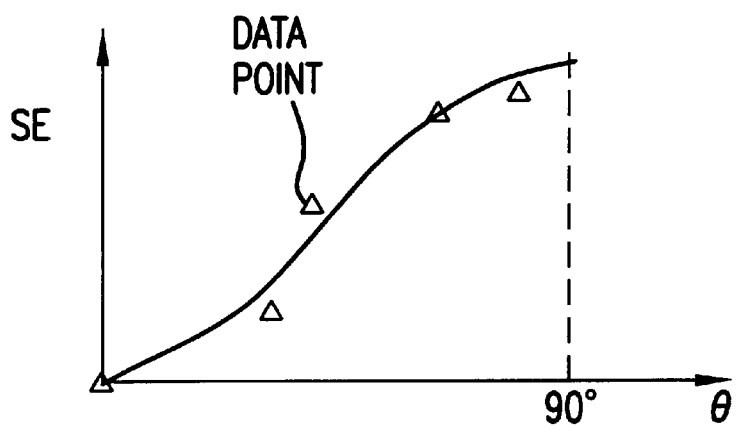
FIG.4

SAMPLE SHAPE DETERMINATION BY MEASUREMENT OF SURFACE SLOPE WITH A SCANNING ELECTRON MICROSCOPE

FIELD OF THE INVENTION

The present invention is directed to determining the shape of a sample with a scanning electron microscope ("SEM") and, in particular, to the use of electron emission from the sample surface to measure its slope.

BACKGROUND OF THE INVENTION

When an SEM emits an electron beam toward a surface, such incident beam produces backscattered electrons and secondary electrons. The number of backscattered and secondary electrons varies with the tilt angle, or slope, of the surface on which the beam is incident. It is expected that more secondary electrons will be emitted from a tilted surface than from a surface normal to the incident beam because with increased tilt a larger percentage of the beam interaction with the sample is close enough to the surface for electrons to be emitted.

In Chapter 4 of *Scanning Electron Microscopy and X-Ray Microanalysis* by J. Goldstein et al., Plenum Publishing 1992, the secondary electron emission is said to vary approximately as a secant function. If $\theta$ is the angle between the incident beam and a line normal to the sample surface, which makes $\theta$ the tilt angle, and because $\sec\theta = 1/\cos\theta$, according to this relationship the secondary electron emission varies as a reciprocal of $\cos\theta$.

It would be valuable to use the SEM for determining the three-dimensional shape of a sample. In order to do so, however, it is necessary for the SEM to accurately measure the tilt angle of the sloped surfaces of the sample. If tilt were to be measured from the secondary electron emission determined in accordance with the relationship mentioned above, the result would be affected by the fact that it yields an emission of infinity at $\theta = 90°$. If such a faulty relationship were to be relied upon to determine slope, incorrect tilt angles would be derived.

SUMMARY OF THE INVENTION

An object of the invention is to accurately measure the slope of a surface with an SEM.

This and other objects are attained in accordance with one aspect of the invention by determining the slope of a surface with an electron beam from a scanning electron microscope (SEM). A calibration procedure is performed which includes:

(i) obtaining a plurality of SE measurements by measuring electron emission SE from a portion of the surface positioned at respective known angles $\theta$ to the electron beam, and (ii) deriving a relationship between SE and $\theta$ based on the plurality of measurements. The electron beam is then directed to impact on a point of the surface to produce a measured SE, and the slope at the point is determined by deriving angle $\theta$ from the measured SE and the obtained relationship.

BRIEF DESCRIPTION OF THE DRAWINGS

FIG. 1 shows a cross-section of a sample with sloped walls being imaged by an electron beam from an SEM.

FIG. 2 is a graph of secondary electrons emitted by the sample of FIG. 1 at different points as the beam moves along its surface.

FIG. 4 is a graph of secondary electron emission as a function of the tilt angle.

DETAILED DESCRIPTION OF THE PREFERRED EMBODIMENT

Figure 3:
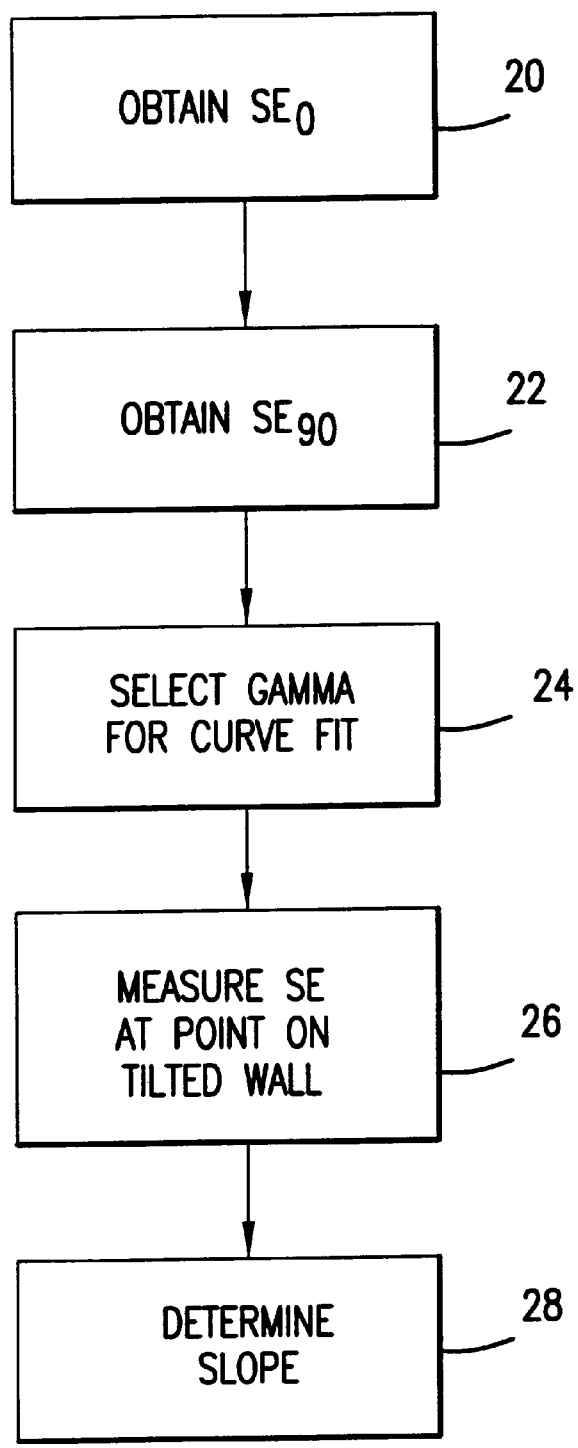
FIG. 3 is a flowchart of steps performed in accordance with the invention.

FIG. 1 shows a sample 1 formed on a substrate 2. The shape of sample 1 has been arbitrarily selected for illustrative purposes to have a planar surface 3 and sloping walls 5 and 7 with equal and oppositely tilted angles. Incident electron beam 9 is emitted by an SEM (not shown), and the number of secondary electrons emitted by sample 1 which strike an electron detector in the SEM (not shown) are counted, as explained below. The positioning of the detector, or multiple detectors, is a matter of choice by the designer and/or user of the SEM, dependent on factors readily known to one with ordinary skill in the art.

FIG. 2, which is aligned with FIG. 1, shows the magnitude of secondary electron emission SE as beam 9 is scanned to be incident at discrete points spaced along the surface of sample 1. Of course, the actual SE values depend on such factors as the sample material, the SEM design and operation, as well as sample charging and sample geometry. However, FIG. 2 is intended to illustrate an exemplary variation that can occur in SE for the sloped walls 5,7 and the planar surface 3 which is normal to the beam. Thus, it is clear that the secondary electron emission between points b and c corresponding to tilted wall 5 is higher than between points c and d corresponding to planar surface 3 at $\theta = 0°$. However, in order to determine the tilt angle of walls 5,7 it is necessary to know quantitatively how SE varies with tilt angle.

To determine a quantitative relationship between SE and tilt angle, such as shown in FIG. 4, the present invention carries out a pre-test procedure, or calibration, for the purpose of determining the three-dimensional shape of the sample or of a batch of identically-shaped samples. The sample is placed in the SEM, the beam 9 is aimed at a portion of its surface which is at a known angle $\theta$ to the beam, and the SE value is recorded. The values of $\theta$ and SE constitute one data point on the graph of FIG. 4. A plurality of such data points is obtained by tilting the sample to known angles and measuring SE at each angle, and then a best-fit curve technique is applied in a well known way to the data points. The curve shown in FIG. 4 has been derived in this way.

After this calibration procedure is completed, beam 9 is scanned along a portion of interest in the surface of the sample. For each discrete surface location where the beam impacts the surface, the SE measurement is converted into an angle $\theta$ by utilizing the relationship depicted in FIG. 4, or its mathematical representation. Of course, no details in this regard are deemed necessary because this is well known.

The measured slope can yield the three-dimensional shape of the sample because it indicates how the surface shape varies in a direction perpendicular to beam 9. Thus, by integrating the value of slope obtained at each of the scanned points, the shape shown in FIG. 1 can be derived in a well known way.

In accordance with the preferred embodiment of the invention, the following relationship between SE and slope has been discovered:

$$SE = \left[\left(1 - \cos\left(\frac{\pi}{180} \cdot Slope\right)^{gamma}\right)(SE_{90} - SE_0)\right] + SE_0 \quad (1)$$

where,

SE is the measured secondary electron emission at a selected point on the surface of sample 1;

$SE_0$ is a known secondary electron emission at $\theta=0°$;

$SE_{90}$ is a known secondary electron emission at $\theta=90°$; and gamma is a curve fitting term.

To find the slope, a rearrangement of terms yields the following:

$$Slope = \frac{180}{\pi} \cdot \arccos\left(1 - \frac{SE - SE_0}{SE_{90} - SE_0}\right)^{1/gamma} \quad (2)$$

In accordance with the preferred embodiment of the invention, before SE measurements are made to find the angle of a tilted wall, the values of $SE_0$ and $SE_{90}$ are determined and used as data points for deriving the curve in FIG. 4. A value of gamma is selected in Eq. (1) to obtain a curve SE having the best fit for these known data points. Such a curve fitting technique is well known.

One advantage of using the preferred embodiment is that it simplifies the calibration while providing satisfactory results. More specifically, it is necessary to provide only a minimal number of data points beyond the two data points $SE_0$ and $SE_{90}$, rather than the higher number of data points otherwise needed for curve fitting. However, if gamma is known, then only two data points are required. Gamma can be known from previous data collected using a similar SEM and working with similar sample materials.

Once $SE_0$, $SE_{90}$ and gamma are known, SE measurements are made by scanning beam 9 to impact the sample surface. When such impact is at a point on the tilted wall of the sample, for example, the measured SE is entered into Eq. (2) to derive the slope at that point.

Turning now to FIGS. 3 and 4 for a more specific explanation of the preferred embodiment of the invention, sample 1 is placed in the SEM and beam 9 is aimed at a point on the planar surface 3. In step 20, planar surface 3 is at $\theta=0°$. Beam 9 is actuated and a measurement of SE is recorded which serves as $SE_0$. In step 22, sample 1 is tilted so that planar surface 3 is at a known angle other than 0° to derive $SE_{90}$.

The tilt angle cannot actually be set at exactly 90° because to measure SE of the surface at this angle is not possible since the beam does not impact on the surface but, rather, on its edge. Therefore, it is preferable to measure the SE at an angle very near to 90°. Typically, SE does not vary significantly for $\theta$ between 85° and 90°, and often such measurements can have sufficient accuracy to give meaningful results. Thus, this measurement can be used as the substantial equivalent of $SE_{90}$.

Alternatively, a data point at an angle other than 90° can be used in step 24 to best-fit a curve, such as the one depicted in FIG. 4. From this curve, a value for $SE_{90}$ can be derived. Also, if additional data points are obtained from measurements of SE made at several more known tilt angles, this may yield a better curve fit and, as a result, better values for $SE_0$, $SE_{90}$ and gamma. Thus, with the preferred embodiment as based on equation (1), it is not necessary to make measurements for nearly as many data points as would otherwise be needed, but it is helpful to have more than just two.

Step 22 is performed before step 24 if $SE_{90}$ is obtained directly from SE measured at an angle very near to $\theta=90°$. Otherwise, step 22 is comprised of one or more SE measurements made at known angles to derive additional data points, followed by step 24, and only then is $SE_{90}$ derived.

In step 26, the measurement of tilt angle for a batch of samples is commenced. Thus, steps 20, 22 and 24 can be regarded as calibration steps carried out using one or more samples out of this batch. After that phase is completed, a sample to be measured is mounted into position in the SEM and its surface is scanned by beam 9. When beam 9 reaches a designated position on a tilted wall, the SE measurement is recorded.

In step 28, the measured value of SE is inputted into Eq. (2), and the tilt angle is thus derived. With the slope angle being known at each of the scanned points, the three-dimensional shape of the sample can be determined.

Although only the preferred embodiment has been described in detail herein, it should be appreciated that various modifications thereto can be readily made by one with ordinary skill in the art. For example, the measured value of SE can include a backscatter component as well as a secondary electron component. Also, the measured value of SE can be exclusively a backscatter component. These and other such changes are intended to fall within the scope of the present invention as defined by the following claims.

I claim:

1. A method for determining the slope of a surface imaged by an electron beam from a scanning microscope (SEM), comprising:

running a calibration procedure with one sample from a batch of samples, including,
obtaining a plurality of calibration electron emission measurements by measuring electron emission from a portion of a surface from said one sample positioned at respective known different angles $\theta$ to the electron beam, and
deriving a relationship between the plurality of calibration electron emission measurements and said known angles $\theta$;

running a measurement procedure with another sample from said batch, including,
directing the electron beam to impact on a point of a surface from said other sample to produce a measured electron emission; and
determining the slope of the surface from said other sample at said point by deriving an angle $\theta$ from said measured electron emission and said relationship between the plurality of calibration electron emission measurements and said known angles $\theta$.

2. The method of claim 1, wherein the calibration procedure of measuring electron emission comprises placing said surface portion of the one sample in a path of the electron beam at said known angles $\Theta$ and detecting the number of resulting secondary electrons respectively emitted by said surface.

3. The method of claim 2, wherein the calibration procedure of deriving a relationship comprises applying a best-fit curve to said plurality of calibration electron emission measurements in accordance with the following:

$$SE = \left[\left(1 - \cos\left(\frac{\pi}{180} \cdot Slope\right)^{gamma}\right)(SE_{90} - SE_0)\right] + SE_0$$

where,

SE is the number of secondary electrons detected at a selected point on the surface of sample 1;

$SE_0$ is a number of secondary electrons detected at $\theta=0°$;

$SE_{90}$ is a number of secondary electrons detected at $\theta=90°$; and gamma is a curve fitting term.

4. The method of claim 3, further comprising deriving said $SE_{90}$ by placing a sample surface in the electron beam at several known angles $\Theta$, obtaining several measurements of SE for said several known angles, respectively, determining a relationship between $\Theta$ and SE based on said several measurements, and applying such relationship to derive $SE_{90}$.

5. The method of claim 3, further comprising the step of deriving $SE_{90}$ by measuring SE for a known angle $\Theta$ substantially near 90°.

6. Apparatus for determining the slope of a surface imaged by an electron beam from a scanning electron microscope (SEM), comprising:

means for running a calibration procedure with one sample from a batch of samples, including, measuring means for obtaining a plurality of calibration electron emission measurements by measuring electron emission from a portion of a surface from said one sample positioned at respective known different angles θ to the electron beam, and means for deriving a relationship between the plurality of calibration electron emission measurements and said known angles θ;

means for running a measurement procedure for another sample from said batch, including, means for directing the electron beam to impact on a point of a surface from said other sample to produce a measured electron emission; and means for determining the slope of the surface from said other sample at said point by deriving an angle θ from said measured electron emission and said relationship between the plurality of calibration electron emission measurements and said known angles θ.

7. The apparatus of claim 6, wherein the measuring means comprises placing said surface portion of the one sample in a path of the electron beam at said known angles $\Theta$ and detecting the number of resulting secondary electrons respectively emitted by said surface.

8. The apparatus of claim 7, wherein the means for deriving a relationship comprises applying a best-fit curve to said plurality of calibration electron emission measurements in accordance with the following:

$$SE = \left[\left(1 - \cos\left(\frac{\pi}{180} \cdot Slope\right)^{gamma}\right)(SE_{90} - SE_0)\right] + SE_0$$

where,

SE is the number of secondary electrons detected at a selected point on the surface of sample 1;

$SE_0$ is a number of secondary electrons detected at $\theta=0°$;

$SE_{90}$ is a number of secondary electrons detected at $\theta=90°$; and gamma is a curve fitting term.

9. The apparatus of claim 8, further comprising means for deriving $SE_{90}$ by placing a sample surface in the electron beam at several known angles $\Theta$, means for obtaining several measurements of SE for said several known angles, respectively, means for determining a relationship between $\Theta$ and SE based on said several measurements, and means for applying such relationship to derive $SE_{90}$.

10. The method of claim 8, further comprising means for deriving $SE_{90}$ by measuring SE for a known angle $\Theta$ substantially near 90°.

* * * * *